United States Patent
Kim et al.

[11] Patent Number: 6,103,432
[45] Date of Patent: Aug. 15, 2000

[54] METHOD FOR FORMING BLACK MATRIX

[75] Inventors: Hyun-jin Kim, Sungnam; Hong-kyu Choi, Suwon; Ki-jun Kim, Seoul, all of Rep. of Korea

[73] Assignee: Samsung Display Devices Co., Ltd., Kyungki-do, Rep. of Korea

[21] Appl. No.: 09/289,540

[22] Filed: Apr. 12, 1999

[30] Foreign Application Priority Data

May 15, 1998 [KR] Rep. of Korea ............... 98-17570

[51] Int. Cl.[7] .................. H01J 29/32; G03F 7/00
[52] U.S. Cl. ........................... 430/25; 430/28
[58] Field of Search ..................... 430/25, 28

[56] References Cited

U.S. PATENT DOCUMENTS

| | | | |
|---|---|---|---|
| 4,537,851 | 8/1985 | Nonogaki et al. | 430/144 |
| 5,498,498 | 3/1996 | Uchikawa et al. | 430/7 |
| 5,626,994 | 5/1997 | Takayanagi et al. | 430/7 |

FOREIGN PATENT DOCUMENTS 2754635  4/1998  France .

*Primary Examiner*—John A. McPherson
*Attorney, Agent, or Firm*—Leydig, Voit & Mayer

[57] ABSTRACT

A method for forming a black matrix includes forming a black matrix applying a photoresist forming composition containing a compound represented by the formula (1) on the inner surface of a panel and drying the same to form a photoresist layer; exposing the photoresist layer; applying a black pigment solution for forming a black matrix on the photoresist layer and drying the same to form a black pigment layer; and developing the resultant structure;

[Formula 1]

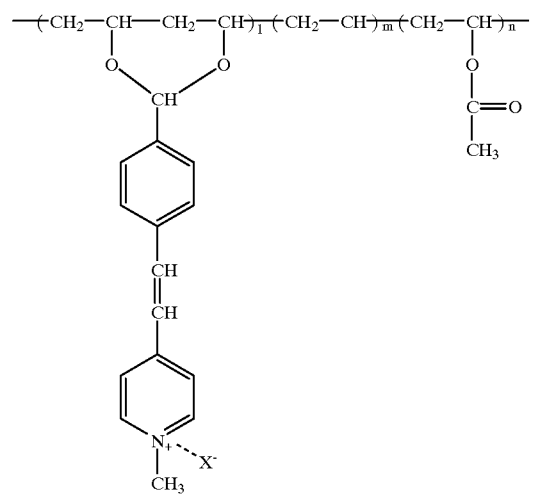

wherein, X is a halogen atom and l:m:n is 1.0–4.5:70.0–98.0:1.0–20.0. The method for forming a black matrix is a non-etching method, which is a simplified process and is not detrimental to environment. Also, since the black matrix material can be recovered from a developing solution for recycling, it is economical. Also, since the photoresist forming composition of the present invention has a good photosensitivity, a black matrix having an excellent landing margin can be obtained. Also, blackness of the black matrix pattern can be improved by using a Ti-containing black pigment as the black matrix forming composition.

7 Claims, 1 Drawing Sheet

METHOD FOR FORMING BLACK MATRIX

BACKGROUND OF THE INVENTION

1. Field of the Invention

The present invention relates to a black matrix, and more particularly, to a method for forming a black matrix for a cathode ray tube (CRT) having excellent landing margin and blackness by a non-etching method.

2. Description of the Related Art

Generally, green, red, and blue phosphors are regularly arranged in a dotted or striped pattern in the inner surface of a color CRT, and electron beams irradiate onto a target dot or stripe to make the corresponding phosphor luminesce.

However, the electron beams do not irradiate onto a target dot or stripe exactly but an adjacent phosphor dot or stripe of another color may also luminesce, which lowers color purity. Also, a fluorescent layer may luminesce due to electrons scattering at the inner wall of a panel or around shadow mask apertures, which causes lowering of contrast.

To avoid such lowering of color purity and contrast, generally a non-luminescent absorbent such as graphite is filled in a space between the respective phosphor dots or stripes to form a black matrix.

A black matrix is largely classified into a negative black matrix and a positive black matrix according to the size of a phosphor dot or stripe and the size of an electron beam irradiating onto a dot or stripe.

According to the negative black matrix, the irradiated beam is made larger than the phosphor dot or stripe, a landing margin is excellent, and contrast and luminance can be improved. However, if the black matrix size between the red, green, and blue phosphors cannot be adjusted uniformly, a poor quality screen, e.g. a color blot, is liable to be generated.

The negative black matrix is generally fabricated in the following manner.

First, a negative photoresist forming composition comprising a base resin, a binder, a dispersant, and a hardening agent are applied to the inner surface of a panel of a CRT and dried to form a photoresist layer. Then, the photoresist layer is exposed to light and developed so that an exposed portion where phosphor patterns are to be formed is hardened by a photo-reaction, to thereby form a photoresist pattern having a strong adherence to an underlying layer (here, the inner surface of the CRT panel) and being not developed by water.

Subsequently, graphite is applied to the photoresist pattern to form a black matrix layer. Then, etching and developing processes are sequentially performed to remove the exposed portion of the photoresist layer and the black matrix material layer on the exposed layer, thereby completing a black matrix pattern.

As described above, the negative black matrix is, however, formed through a long and complicated process line, and requires an etching step in which materials detrimental to the environment are used.

Also, manufacturing cost is too high to use Ti-containing black pigment composition which can form a black matrix having excellent blackness.

On the contrary, according to a positive black matrix, the irradiated beam is made smaller than the phosphor dot or stripe. Although an excellent landing margin is not easily obtained, the positive black matrix is advantageous in being easily fabricated without an etching step. However, since a photoresist forming material suitable for this method is not in practical use, the positive black matrix is not widely used.

SUMMARY OF THE INVENTION

To solve the above problems, it is an objective of the present invention to provide a method for forming a positive black matrix having excellent blackness and an improved landing margin.

Accordingly, to achieve the above objective, there is provided a method for forming a black matrix comprising the steps of:

coating a photoresist forming composition containing a compound represented by the formula (1) on the inner surface of a panel and drying the same to form a photoresist layer;

exposing the photoresist layer;

coating a black pigment solution for forming a black matrix on the photoresist layer and drying the same to form a black pigment layer; and developing the resultant structure;

[Formula 1]

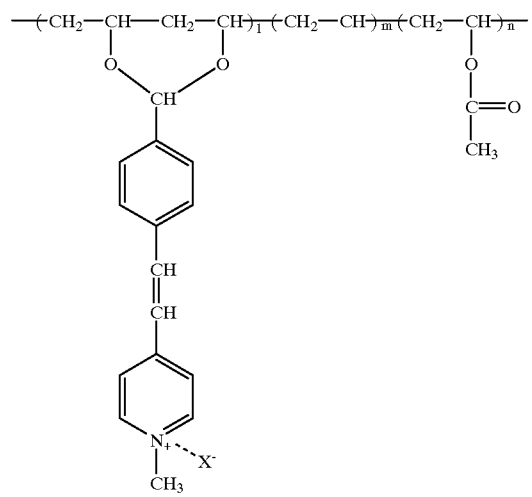

wherein, X is a halogen atom and l:m:n is 1.0–4.5:70.0–98.0:1.0–20.0.

Particularly, the main chain of the compound represented by the formula (1) has a degree of polymerization of 300 to 4000. Also, the photoresist forming composition further comprises a surfactant of 0.5 to 5.0% by weight with respect to the compound represented by the formula (1). Here, if the content of the surfactant is not less than the above range, a sufficient surface activity does not occur, whereas, if the content of the sufactant is over the above range, surface activity is not enhanced further and the surplus amount of surfactant is not removed during subsequent processes.

Preferable examples of the surfactant include polyoxyethylene-polyoxypropylene copolymer (for example, PES manufactured by BASF AG.), fluorocarbon-denatured polyacrylate (for exampled, EFKA7070 manufactured by EFKA) or the like.

Also, the black pigment composition for forming the black matrix is not specifically restricted if it can be used in the art of the present invention, and preferably, it can be selected from graphite and Ti-containing black pigment composition. Particularly, the Ti-containing black pigment composition is more preferably because it can fabricate a black matrix having more excellent blackness than the conventional black matrix forming composition containing graphite.

The compound represented by the formula (1) which is a main component of the photoresist forming composition according to the present invention, is a copolymer of vinyl alcohol-vinyl acetate acetalated by 4-[2-(4-formyl phenyl) ethenyl]-1-methylpyridinium salt, which is nontoxic and excellent in storage stability and thermal stability. Also, whereas the photoresist forming composition used for forming the negative black matrix includes a base resin and a photosensitive agent causing a cross linkage reaction with the base resin, the photoresist forming composition according to the present invention does not require a separate photosensitive agent since the compound represented by the formula (1) itself has a function as a photosensitive agent.

According to the present invention, the positive photoresist forming composition containing the compound represented by the formula (1) is coated on the inner surface of the CRT panel to form a photoresist layer and then exposed using a shadow mask so that the exposed portion is softened to have a structure deprived of adhesiveness with the underlying layer (the inner surface of the CRT panel).

Subsequently, the black matrix forming composition is coated on the photoresist layer to form a black matrix material layer and developed with water, so that the exposed portion of the photoresist layer and the black matrix material layer formed thereon are easily developed and removed to thus form a black matrix pattern on the upper layer of the non-exposed portion, thereby providing a phosphor forming portion.

In other words, since the method of the present invention does not require an etching process, the process is simplified and is free from environmental contamination caused by using an etching solution.

Also, the photosensitivity of the compound represented by the formula (1) is so excellent that the profile of the formed pattern becomes better, thereby improving a landing margin, compared to the conventional positive black matrix.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

Hereinafter, the method for forming a black matrix according to the present invention will be described with reference to the accompanying drawings.

Figure 1A:
FIGS. 1A through 1D illustrate sequentially a method for forming a black matrix according to the present invention.

First, the inner surface of a glass panel 10 is cleaned, a photoresist forming composition having a compound represented by the formula (1) as a main component is applied and dried to form a photoresist layer 20 (FIG. 1A).

[Formula 1]

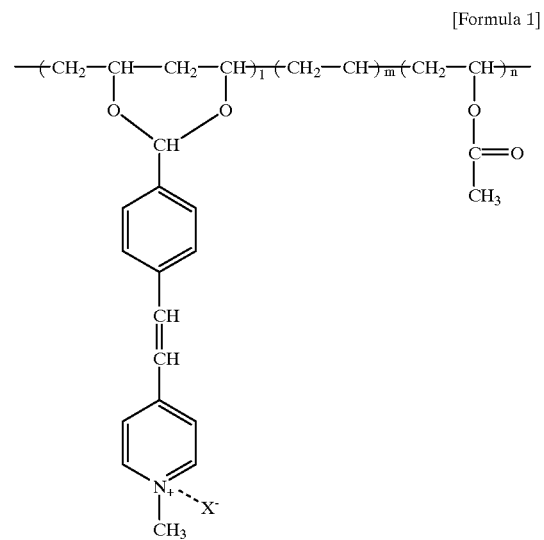

wherein, X is a halogen atom and l:m:n is 1.04–5:70.0–98.0:1.0–20.0.

Particularly, the main chain of the compound represented by the formula (1) has a degree of polymerization of 300 to 4000. Also, the photoresist forming composition further comprises a surfactant of 0.5 to 5.0% by weight with respect to the compound represented by the formula (1). Here, if the content of the surfactant is not less than the above range, a sufficient surface activity does not occur, whereas, if the content of the sufactant is over the above range, surface activity is not enhanced further and the surplus amount of surfactant is not removed during subsequent processes.

Preferable examples of the surfactant include polyoxyethylene-polyoxypropylene copolymer (for example, PES manufactured by BASF AG.), fluorocarbon-denatured polyacrylate (for exampled, EFKA7070 manufactured by EFKA) or the like.

The compound represented by the formula (1), which is a main component of the photoresist forming composition according to the present invention, is a copolymer of vinyl alcohol-vinyl acetate acetalated by 4-[2-(4-formyl phenyl) ethenyl]-1-methylpyridinium salt, which is nontoxic and excellent in storage stability and thermal stability. Also, whereas the photoresist forming composition used for forming the negative black matrix includes a base resin and a photosensitive agent causing a cross linking reaction with the base resin, the photoresist forming composition according to the present invention does not require a separate photo-sensitive agent since the compound represented by the formula (1) itself functions as a photosensitive agent.

Figure 1B:
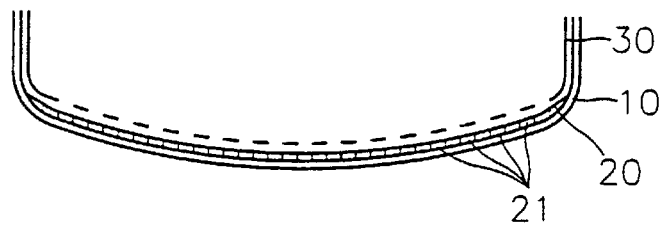

Subsequently, a shadow mask 30 covers a part of the photoresist layer 20 and is exposed to light so that an exposed portion 21 of layer 20 is changed into a structure that can be easily developed with water (FIG. 1B).

Figure 1C:
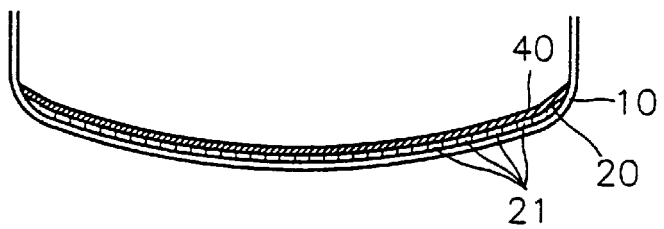

After the exposing step, the black matrix forming composition is applied to the photoresist layer 20 to form a black matrix material layer 40 (FIG. 1C).

The black pigment in the black matrix composition is not particularly limited but, preferably, is selected from graphite and Ti-containing black pigments. A Ti-containing black pigment composition is preferable because it produces a black matrix having better blackness than the conventional composition containing graphite.

Figure 1D:

Successively, the resultant structure is developed with water using a nozzle to remove the exposed portion of the layer 20 and the black matrix material layer formed thereon, thereby forming a black matrix pattern 50 (FIG. 1D).

After the developing step, the black matrix material contained in the developing solution is separated from the recovered solution and recovered for recycling.

The method for forming a black matrix according to the present invention is a non-etching method, which is a simplified process and is not detrimental to the environment. Also, since the black matrix material can be recovered from a developing solution for recycling, it is economical. Also, since the photoresist forming composition of the present invention has a good photosensitivity, a black matrix having an excellent landing margin can be obtained. Furthermore, in case of using a Ti-containing black pigment as the black matrix forming composition, blackness of the black matrix pattern can be improved.

What is claimed is:

1. A method for forming a black matrix comprising:

applying a photoresist forming composition containing a compound represented by the formula (1) on the inner surface of a panel and drying to form a photoresist layer;

exposing the photoresist layer;

applying a black pigment solution for forming a black matrix on the photoresist layer and drying to form a black pigment layer; and developing the photoresist;

[Formula 1]

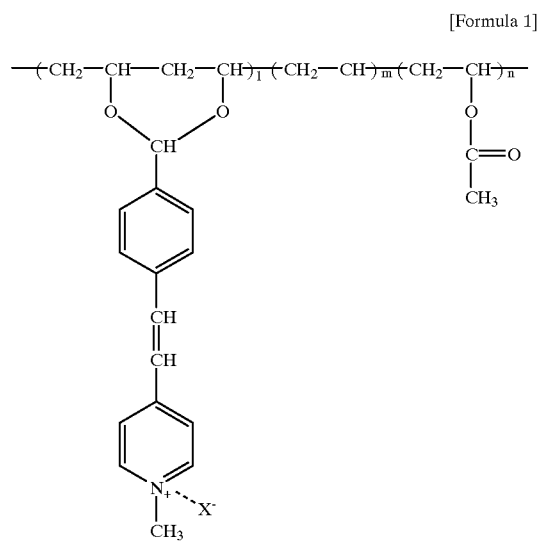

wherein, X is a halogen atom and l:m:n is 1.0–4.5:70.0–98.0:1.0–20.0.

2. The black matrix forming method according to claim 1, wherein the compound represented by the formula (1) has a main chain with a degree of polymerization of 300 to 4000.

3. The black matrix forming method according to claim 1, wherein the photoresist forming composition further comprises a surfactant in a concentration of 0.5 to 5.0% by weight with respect to the compound represented by the formula (1).

4. The black matrix forming method according to claim 3, wherein the surfactant is polyoxyethylene-polyoxypropylene copolymer.

5. The black matrix forming method according to claim 3, wherein the surfactant is fluorocarbon-denatured polyacrylate.

6. The black matrix forming method according to claim 1, wherein the black pigment composition for forming a black matrix comprises a Ti-containing black pigment composition.

7. The black matrix forming method according to claim 1, wherein the black pigment composition for forming a black matrix comprises a graphite-containing black pigment composition.

* * * * *